United States Patent
Ding et al.

(10) Patent No.: US 8,416,001 B2
(45) Date of Patent: Apr. 9, 2013

(54) TECHNIQUES FOR REDUCING DUTY CYCLE DISTORTION IN PERIODIC SIGNALS

(75) Inventors: Weiqi Ding, Fremont, CA (US); Sergey Shumarayev, Los Altos Hills, CA (US); Wilson Wong, San Francisco, CA (US); Tim Tri Hoang, San Jose, CA (US); Yanjing Ke, Union City, CA (US)

(73) Assignee: Altera Corporation, San Jose, CA (US)

( * ) Notice: Subject to any disclaimer, the term of this patent is extended or adjusted under 35 U.S.C. 154(b) by 91 days.

(21) Appl. No.: 13/083,431

(22) Filed: Apr. 8, 2011

(65) Prior Publication Data

US 2012/0256670 A1    Oct. 11, 2012

(51) Int. Cl.
*H03K 3/017* (2006.01)
*H03K 5/04* (2006.01)
*H03K 7/08* (2006.01)

(52) U.S. Cl. .................. 327/175; 327/176; 327/177

(58) Field of Classification Search .................. 327/175, 327/176, 177
See application file for complete search history.

(56) References Cited

U.S. PATENT DOCUMENTS

| | | | |
|---|---|---|---|
| 7,612,620 B2 * | 11/2009 | Rausch et al. | 331/45 |
| 2008/0025383 A1 | 1/2008 | Li | |
| 2008/0240212 A1 | 10/2008 | Satou | |
| 2010/0093282 A1 | 4/2010 | Martikkala et al. | |
| 2010/0284489 A1 | 11/2010 | Bae et al. | |

OTHER PUBLICATIONS

Korean Intellectual Property Office, International Search Report and Written Opinion of the International Searching Authority, international application PCT/US2012/030753, Nov. 30, 2012, pp. 1-8.

* cited by examiner

*Primary Examiner* — John Poos
(74) *Attorney, Agent, or Firm* — Steven J. Cahill

(57) ABSTRACT

A transmitter circuit is operable to provide an output signal in response to a first periodic signal. A multiplexer circuit is operable to provide a second periodic signal as a selected signal during a first phase of operation. The multiplexer circuit is operable to provide the output signal of the transmitter circuit as the selected signal during a second phase of operation. A sampler circuit is operable to generate first samples of the selected signal during the first phase of operation. The sampler circuit is operable to generate second samples of the selected signal during the second phase of operation. A duty cycle control circuit is operable to adjust a duty cycle of the first periodic signal based on the first and the second samples.

21 Claims, 7 Drawing Sheets

TECHNIQUES FOR REDUCING DUTY CYCLE DISTORTION IN PERIODIC SIGNALS

FIELD OF THE INVENTION

The present invention relates to electronic circuits, and more particularly, to techniques for reducing duty cycle distortion in periodic signals.

BACKGROUND

One type of conventional transmitter circuit includes a serializer circuit. The serializer circuit includes X-to-2 multiplexer circuits, a 2-to-1 multiplexer circuit, and a frequency divider circuit. An X number of input data signals are provided in parallel to multiplexing inputs of the X-to-2 multiplexer circuit. Parallel data bits are embodied in the input data signals.

Complementary input clock signals are provided through a clock network to inputs of a buffer circuit. The buffer circuit buffers the input clock signals to generate complementary output clock signals that are ideally 180° out of phase. The buffer circuit includes 6 inverter circuits. The first and second inverter circuits in the buffer circuit are connected together in series. The first and second inverter circuits buffer a first one of the input clock signals received at an input of the first inverter circuit to generate a first one of the output clock signals at an output of the second inverter circuit. The third and fourth inverter circuits in the buffer circuit are connected together in series. The third and fourth inverter circuits buffer a second one of the input clock signals received at an input of the third inverter circuit to generate a second one of the output clock signals at an output of the fourth inverter circuit.

The fifth and sixth inverter circuits in the buffer circuit are cross-coupled inverter circuits. The input of the fifth inverter circuit is connected to the output of the first inverter circuit, to the input of the second inverter circuit, and to the output of the sixth inverter circuit. The output of the fifth inverter circuit is connected to the output of the third inverter circuit, to the input of the fourth inverter circuit, and to the input of the sixth inverter circuit.

The output clock signals are provided to inputs of the frequency divider circuit and to select inputs of the 2-to-1 multiplexer circuit. The frequency divider circuit generates complementary frequency divided clock signals in response to the output clock signals. The frequency of each of the frequency divided clock signals is a fraction of the frequency of one of the output clock signals.

The X-to-2 multiplexer circuits provide the data bits in the input data signals to their outputs as even and odd data signals in response to the frequency divided clock signals. The X-to-2 multiplexer circuits provide half of the data bits in the input data signals as serial data bits in the even data signal. The X-to-2 multiplexer circuits provide the other half of the data bits in the input data signals as serial data bits in the odd data signal. The even data signal contains data bits in the even numbered unit intervals of the input data signals, and the odd data signal contains data bits in the odd numbered unit intervals of the input data signals. The even and odd data signals are provided to multiplexing inputs of the 2-to-1 multiplexer circuit.

The 2-to-1 multiplexer circuit converts the even and odd data signals into a single output data signal containing a serial stream of data bits in response to the output clock signals. The output data signal includes the data bits from the even data signal interleaved with the data bits from the odd data signal. The serial data bits in the output data signal can be represented as EOEOEOEOE . . . , where bits E are from the even data signal, and bits O are from the odd data signal.

The 2-to-1 multiplexer circuit includes two registers. The outputs of the two registers are coupled to the output of the 2-to-1 multiplexer circuit that generates the output data signal. The first register stores data bits in the even data signal at the output of the 2-to-1 multiplexer circuit in the output data signal in response to rising edges in the first one of the output clock signals. The second register stores data bits in the odd data signal at the output of the 2-to-1 multiplexer circuit in the output data signal in response to rising edges in the second one of the output clock signals. The transmitter circuit transmits the output data signal to a receiver circuit.

The output clock signals should have 50% duty cycles. Duty cycle typically refers to the ratio between the duration of a logic high state in a signal and the period of the signal. The frequencies of the output clock signals equal one-half the data rate of the output data signal. The output clock signals may have duty cycle distortion (DCD). DCD causes the duty cycle of a periodic signal to vary from an ideal value. DCD causes the duty cycle of the output clock signals to be greater than or less than 50%. DCD may be caused, for example, by variations between the pull-up currents and the pull-down currents generated by transistors in the clock network. DCD in the output clock signals is dependent on variations in the process, the supply voltage, and the temperature of the transmitter circuit.

Duty cycle distortion (DCD) in the output clock signals may cause the 2-to-1 multiplexer circuit to generate data dependent jitter in the output data signal. Jitter in the output data signal may cause the receiver circuit to sample incorrect data bits in the output data signal.

As an example, DCD can cause the first one of the input clock signals to have a phase offset with respect to the second one of the input clock signals that is greater than 180°. The input clock signals are ideally 180° out of phase with each other. The buffer circuit described above can prevent phase offsets that are within about 5-10% of the periods of the input clock signals from propagating to the output clock signals. However, process variations that cause mismatches between the transistors in the fifth and sixth inverter circuits in the buffer circuit may add additional DCD to the output clock signals.

As another example, DCD can cause each of the rising edges of the first one of the input clock signals to occur in less time than each of the falling edges of the first one of the input clock signals. DCD can also cause each of the falling edges of the second one of the input clock signals to occur in less time than each of the rising edges of the second one of the input clock signals. The duty cycles of the input clock signals are less than 50% in this example. The buffer circuit described above does not prevent this type of DCD in the input clock signals from propagating to the output clock signals.

BRIEF SUMMARY

According to some embodiments, a transmitter circuit is operable to provide an output signal in response to a first periodic signal. A multiplexer circuit is operable to provide a second periodic signal as a selected signal during a first phase of operation. The multiplexer circuit is operable to provide the output signal of the transmitter circuit as the selected signal during a second phase of operation. A sampler circuit is operable to generate first samples of the selected signal during the first phase of operation. The sampler circuit is operable to generate second samples of the selected signal during the second phase of operation. A duty cycle control circuit is operable to adjust a duty cycle of the first periodic signal based on the first and the second samples. In some embodiments, the duty cycle control circuit adjusts a duty cycle of the first periodic signal based on the first and the second samples to reduce duty cycle distortion in the first periodic signal.

In some embodiments, the second periodic signal is a golden clock signal that is not routed through the transmitter circuit. The first samples generated based on the second periodic signal are not affected by jitter in the output signal of the transmitter circuit. The first samples are compared to the second samples to generate a duty cycle correction value that is used to reduce duty cycle distortion in the first periodic signal.

Various objects, features, and advantages of the present invention will become apparent upon consideration of the following detailed description and the accompanying drawings.

DETAILED DESCRIPTION

Figure 1:
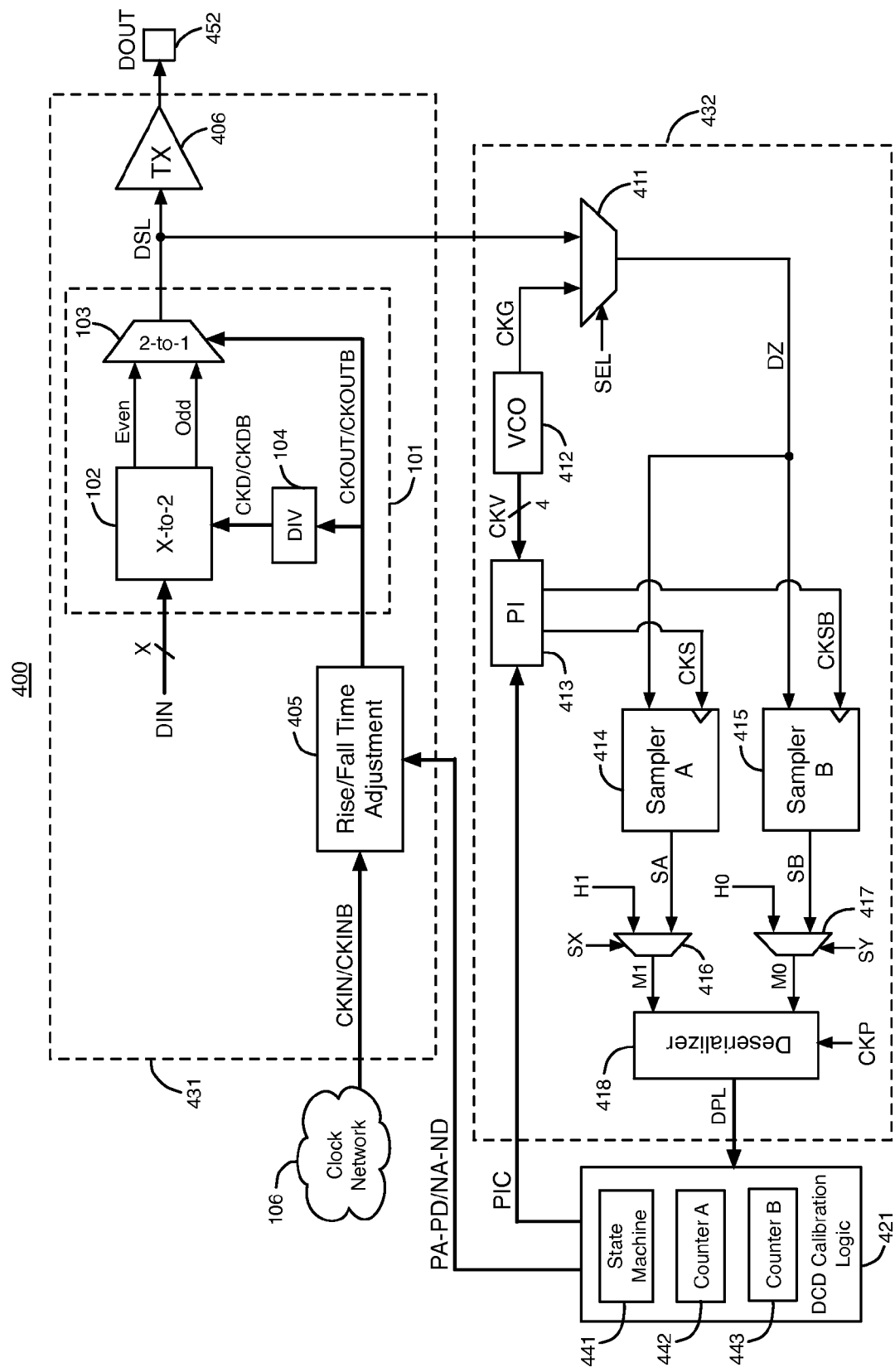
FIG. 1 illustrates an example of a circuit that compensates for duty cycle distortion in two clock signals to generate a serial output data signal, according to an embodiment of the present invention.

FIG. 1 illustrates an example of a circuit 400 that compensates for duty cycle distortion (DCD) in two clock signals CKOUT and CKOUTB that are used to generate a serial output data signal, according to an embodiment of the present invention. Circuit 400 includes a transmitter circuit 431, a receiver circuit 432, and duty cycle distortion (DCD) calibration logic circuit 421. Circuit 400 may be in an integrated circuit. The specific components of circuit 400 are exemplary and not intended to limit the scope of the present invention. Many of the specific components of circuit 400 can be replaced with other components to achieve the intended results as described herein.

Transmitter circuit 431 includes serializer circuit 101, rise/fall time adjustment circuit 405, and transmitter buffer circuit 406. Serializer circuit 101 includes X-to-2 multiplexer circuits 102, a 2-to-1 multiplexer circuit 103, and frequency divider circuit 104. Serializer circuit 101 is merely one example of a serializer circuit that can be used with embodiments of the present invention. An X number of data signals DIN are provided in parallel to multiplexing inputs of multiplexer circuit 102. Parallel data bits are embodied in data signals DIN. are exemplary and not intended to limit the scope of the invention.

Two complementary periodic clock signals CKOUT and CKOUTB generated by rise/fall time adjustment circuit 405 are provided to inputs of frequency divider circuit 104 and to select inputs of multiplexer circuit 103. Frequency divider circuit 104 generates complementary periodic clock signals CKD and CKDB in response to clock signals CKOUT and CKOUTB. The frequency of clock signal CKD is a fraction of the frequency of clock signal CKOUT. The frequency of clock signal CKDB is a fraction of the frequency of clock signal CKOUTB.

Multiplexer circuits 102 provide the data bits in data signals DIN to their outputs as the Even and Odd data signals in response to clock signals CKD and CKDB. Multiplexer circuits 102 provide half of the data bits in data signals DIN as serial data bits in the Even data signal. Multiplexer circuits 102 provide the other half of the data bits in data signals DIN as serial data bits in the Odd data signal. The Even data signal contains data bits in the even numbered unit intervals of data signals DIN, and the Odd data signal contains data bits in the odd numbered unit intervals of data signals DIN. The Even and Odd data signals are provided to multiplexing inputs of multiplexer circuit 103.

Multiplexer circuit 103 converts the Even and Odd data signals into a single output data signal DSL containing a serial stream of data bits in response to clock signals CKOUT and CKOUTB. Output data signal DSL includes the data bits from the Even data signal interleaved with the data bits in the Odd data signal. Thus, the serial data bits in output data signal DSL can be represented as EOEOEOEOE . . . , where bits E are from the Even data signal, and bits O are from the Odd data signal.

Multiplexer circuit 103 may include two registers in one embodiment. The outputs of the two registers are coupled to the output of multiplexer circuit 103 that generates data signal DSL. The first register stores data bits in the Even data signal at the output of multiplexer circuit 103 in data signal DSL in response to rising edges in clock signal CKOUT. The second register stores data bits in the Odd data signal at the output of multiplexer circuit 103 in data signal DSL in response to rising edges in clock signal CKOUTB. Transmitter buffer circuit 406 buffers the data signal DSL generated by serializer circuit 101 to generate an output data signal DOUT. Output data signal DOUT is provided to an output pin 452 of the integrated circuit that contains circuit 400.

Receiver circuit 432 includes 2-to-1 multiplexer circuit 411, voltage-controlled oscillator (VCO) circuit 412, phase interpolator (PI) circuit 413, sampler A circuit 414, sampler B circuit 415, 2-to-1 multiplexer circuit 416, 2-to-1 multiplexer circuit 417, and deserializer circuit 418. DCD calibration logic circuit 421 includes state machine 441, counter A circuit 442, and counter B circuit 443. State machine 441 may perform some or all of the functions that are described below as being performed by DCD calibration logic circuit 421. According to an embodiment, DCD calibration logic circuit 421 may be implemented by programmable logic circuit blocks in a programmable logic integrated circuit.

Transmitter circuit 431 may include additional circuits used for transmitting signals outside the integrated circuit that are not shown in FIG. 1 to simplify the drawing. Receiver circuit 432 may include additional circuits used for receiving signals from outside the integrated circuit that are not shown in FIG. 1 to simplify the drawing.

In one embodiment, voltage-controlled oscillator (VCO) circuit 412 generates 4 periodic clock signals CKV. Clock signals CKV have phase offsets of 0°, 90°, 180°, and 270° relative to each other. Clock signals CKV are provided to inputs of phase interpolator circuit 413. Phase interpolator circuit 413 generates two complementary periodic clock signals CKS and CKSB in response to clock signals CKV. Clock signals CKS and CKSB have phase offsets of 0° and 180°, respectively, relative to each other. As an example, each of clock signals CKS and CKSB has a 50% duty cycle.

Phase interpolator circuit 413 determines the phases of clock signals CKS and CKSB relative to the phases of clock signals CKV based on the logic states of digital phase interpolator control (PIC) signals. DCD calibration logic circuit 421 generates the PIC signals. The PIC signals are provided to inputs of phase interpolator circuit 413. Phase interpolator circuit 413 adjusts the phases of clock signals CKS and CKSB relative to the phases of clock signals CKV based on changes in the logic states of the PIC signals. Clock signal CKS is provided to a clock input of sampler A circuit 414, and clock signal CKSB is provided to a clock input of sampler B circuit 415. According to alternative embodiments, phase interpolator circuit 413 may be replaced with another type of phase adjustment circuit.

VCO circuit 412 also generates a golden periodic clock signal CKG. Golden clock signal CKG may be one of clock signals CKV or a different clock signal generated by VCO circuit 412 having a different phase offset relative to clock signals CKV. Golden clock signal CKG has a duty cycle that is almost precisely 50%. Golden clock signal CKG is provided to a multiplexing input of multiplexer circuit 411. A select signal SEL is provided to a select input of multiplexer circuit 411.

Figure 2:
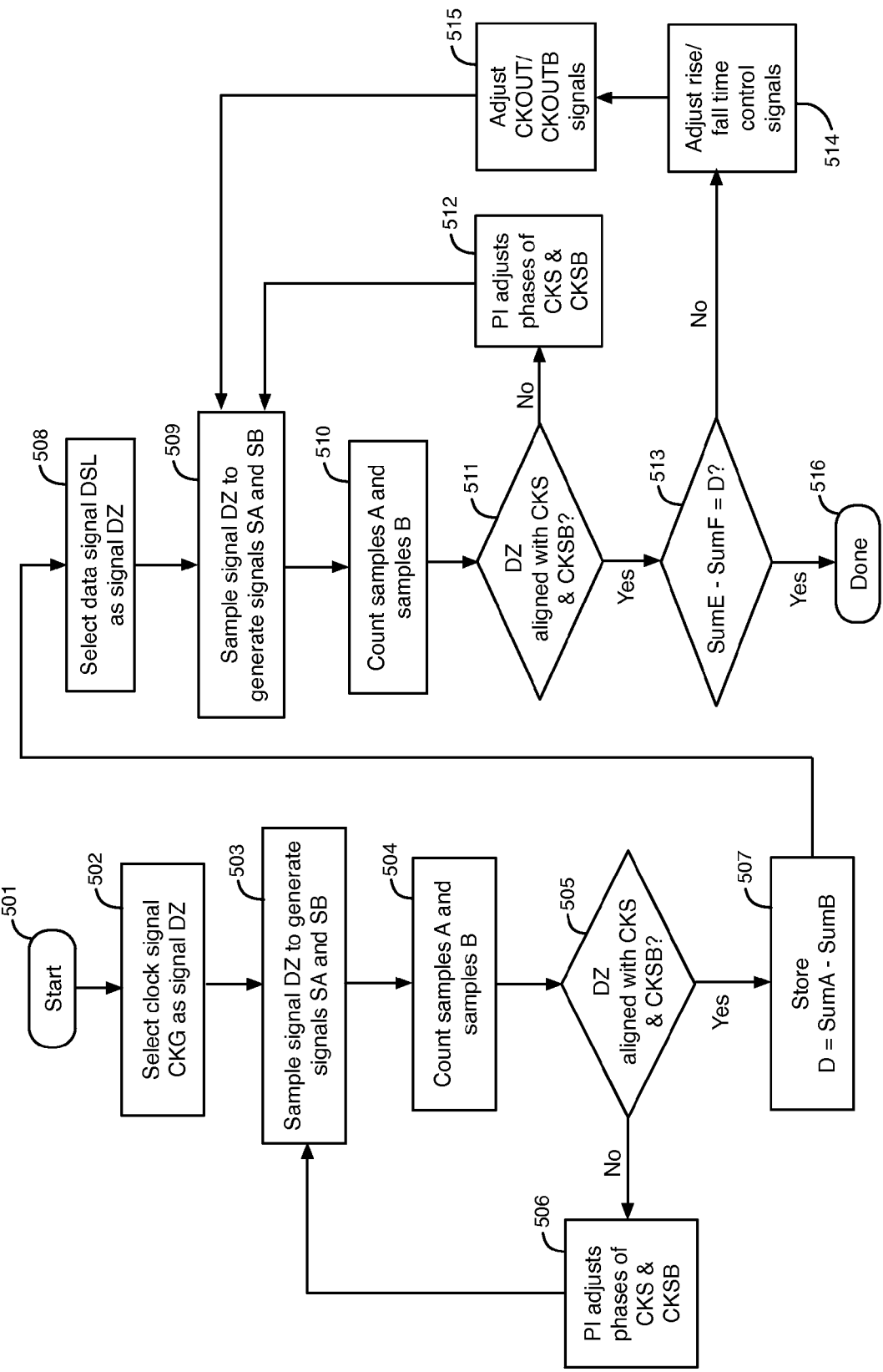
FIG. 2 is an exemplary flow chart of the operations of the circuit in FIG. 1 during the measurement and calibration of duty cycle distortion in clock signals, according to an embodiment of the present invention.

FIG. 2 is an exemplary flow chart of the operations of the circuit in FIG. 1 during the measurement and calibration of duty cycle distortion in clock signals, according to an embodiment of the present invention. The measurement and calibration process of FIG. 2 occurs in two phases of operation. The first phase of operation includes operations 502-507. The second phase of operation includes operations 508-515.

The first phase of operation is a self-calibration phase during which circuit 400 samples the golden clock signal CKG to determine a reference value. Duty cycle distortion (DCD) in clock signals CKOUT and CKOUTB and mismatches between the pull-up and pull-down transistors in serializer circuit 101 may generate jitter in data signal DSL. The reference value is generated by sampling a golden clock signal CKG that is not routed through serializer circuit 101 or clock network 106. Therefore, the reference value is not affected by any jitter in data signal DSL.

During the second phase of the measurement and calibration process of FIG. 2, circuit 400 samples the serial output data signal DSL from serializer circuit 101 to generate a duty cycle distortion (DCD) value. The DCD value is affected by any jitter in data signal DSL. Circuit 400 then compares the DCD value to the reference value to generate a duty cycle correction value. Circuit 400 adjusts the durations of the logic state transitions in clock signals CKOUT and CKOUTB based on the duty cycle correction value to reduce duty cycle distortion in clock signals CKOUT and CKOUTB. The reduction in duty cycle distortion in clock signals CKOUT and CKOUTB causes serializer circuit 101 to generate less jitter in data signal DSL.

Bubble 501 indicates the start of the first phase of the measurement and calibration process of FIG. 2. In operation 502, the select signal SEL is set to a logic state that causes multiplexer circuit 411 to provide golden clock signal CKG from one of its multiplexing inputs to its output as selected signal DZ. Selected signal DZ is provided to data sampling inputs of sampler circuits 414 and 415 as shown in FIG. 1.

Clock signals CKS and CKSB and selected signal DZ have the same frequencies. Sampler circuits 414 and 415 generate signals SA and SB, respectively, that contain sampled bits. In operation 503, sampler A circuit 414 samples selected signal DZ in response to clock signal CKS to generate serial sampled bits in signal SA. Sampler A circuit 414 stores a logic state in signal SA that is the same as the logic state of selected signal DZ in response to each rising edge of clock signal CKS. Also, in operation 503, sampler B circuit 415 samples selected signal DZ in response to clock signal CKSB to generate serial sampled bits in signal SB. Sampler B circuit 415 stores a logic state in signal SB that is the same as the logic state of selected signal DZ in response to each rising edge of clock signal CKSB.

A select signal SX is provided to a select input of multiplexer circuit 416. A first header signal H1 is provided to a first multiplexing input of multiplexer circuit 416. Signal SA is provided to a second multiplexing input of multiplexer circuit 416. A select signal SY is provided to a select input of multiplexer circuit 417. A second header signal H0 is provided to a first multiplexing input of multiplexer circuit 417. Signal SB is provided to a second multiplexing input of multiplexer circuit 417.

Multiplexer circuit 416 provides one of signals H1 or SA to its output as selected signal M1 based on the logic state of select signal SX. Multiplexer circuit 417 provides one of signals H0 or SB to its output as selected signal M0 based on the logic state of select signal SY. Selected signals M1 and M0 are provided to inputs of deserializer circuit 418. Deserializer circuit 418 deserializes the sampled bits in selected signals M1 and M0 to generate parallel sampled bits in a set of parallel signals DPL in response to a periodic clock signal CKP. Parallel signals DPL are provided to inputs of DCD calibration logic circuit 421. Deserializer circuit 418 reduces the data rate of signal DPL relative to the data rates of signals SA and SB so that DCD calibration logic circuit 421 can operate at a lower frequency. In an alternative embodiment, deserializer circuit 418 can be removed, and selected signals M1 and M0 are provided directly to inputs of DCD calibration logic circuit 421.

Signals H1 and H0 are header signals. Header signals H1 and H0 are in different logic states. As an example, header signal H1 is set to a logic high state, and header signal H0 is set to a logic low state. The logic state of each of the header signals H1 and H0 remains the same during the operation of circuit 400.

Before operation 503, select signals SX and SY are set to logic states that cause multiplexer circuits 416 and 417 to provide the logic states of header signals H1 and H0 to their outputs in selected signals M1 and M0, respectively. The logic state of header signal H1 is provided in signal M1 prior to operation 503 so that the bits in parallel signals DPL that are generated by sampler A circuit 414 can be identified. The logic state of header signal H0 is provided in signal M0 prior to operation 503 so that the bits in parallel signals DPL that are generated by sampler B circuit 415 can be identified. During operation 503, select signals SX and SY are set to logic states that cause multiplexer circuits 416 and 417 to provide the logic states of signals SA and SB to their outputs in selected signals M1 and M0, respectively.

Deserializer circuit 418 deserializes serial bits in each of signals M1 and M0 to generate parallel bits in parallel signals DPL in response to clock signal CKP during operation 503. The first sets of parallel bits that deserializer circuit 418 generates in signals DPL include header bits. The header bits are generated based on the logic states of the header signals H1 and H0 that are provided by multiplexer circuits 416 and 417 to deserializer circuit 418 prior to operation 503. The remaining bits that deserializer circuit 418 generates in signals DPL are sampled bits generated by sampler circuits 414-415 during operation 503.

As an example that is not intended to be limiting, deserializer circuit 418 generates 10 parallel signals DPL. Each of the 10 parallel signals DPL indicates 1 bit in each period of clock signal CKP. The 10 bits in the 10 parallel signals DPL in each period of clock signal CKP are numbered 0-9 in this example. The 2 bits numbered 0-1 in each of the first few sets of 10 bits in signals DPL are the header bits. As an example, header bit 0 having a logic high state and header bit 1 having a logic low state indicates that the even numbered bits 2, 4, 6, and 8 in signals DPL equal the sampled bits in signal SA and the odd numbered bits 3, 5, 7, and 9 in signals DPL equal the sampled bits in signal SB. After the first few sets of 10 bits generated in signals DPL, the even numbered bits 0, 2, 4, 6, and 8 in signals DPL equal the sampled bits in signal SA and the odd numbered bits 1, 3, 5, 7, and 9 in signals DPL equal the sampled bits in signal SB.

In operation 504, counter A circuit 442 counts the number of sampled bits generated by sampler A circuit 414 in signal SA that are in logic high states, and counter B circuit 443 counts the number of sampled bits generated by sampler B circuit 415 in signal SB that are in logic high states. DCD calibration logic circuit 421 also determines the total number of sampled bits in signal SA and the total number of sampled bits in signal SB in operation 504.

If, for example, the rising edges of clock signal CKS occur concurrently with the rising edges of selected signal DZ, and the rising edges of clock signal CKSB occur concurrently with the falling edges of signal DZ, then jitter in these three signals causes approximately 50% of the sampled bits in signal SA to be in logic high states and approximately 50% of the sampled bits in signal SB to be in logic high states. In decision operation 505, DCD calibration logic circuit 421 determines the percentage of sampled bits in signal SA that are in logic high states and the percentage of sampled bits in signal SB that are in logic high states based on the total number of sampled bits received in each of signals SA and SB. DCD calibration logic circuit 421 determines how closely the rising edges in clock signals CKS and CKSB are aligned with the rising and falling edges of selected signal DZ based on the percentages of sampled bits in signals SA and SB that are in logic high states in decision operation 505.

If the percentage of sampled bits in signal SA that are in logic high states is greater than or less than about 50%, or the percentage of sampled bits in signal SB that are in logic high states is greater than or less than about 50% in decision operation 505, DCD calibration logic circuit 421 changes the logic states of the PIC signals in operation 506 to cause the rising edges of clock signals CKS and CKSB to be more closely aligned to the rising and falling edges of selected signal DZ. Phase interpolator circuit 413 adjusts the phases of clock signals CKS and CKSB in operation 506 based on the changes in the logic states of the PIC signals that are generated by DCD calibration logic circuit 421. Circuit 400 repeats operations 503-506 until the rising edges of clock signals CKS and CKSB are as closely aligned to the rising and falling edges of selected signal DZ as possible.

When additional phase shifts cannot be made to clock signals CKS and CKSB to more closely align their rising edges with the rising and falling edges of signal DZ, circuit 400 proceeds to operation 507. In operation 507, DCD calibration logic circuit 421 subtracts the number of sampled bits in signal SB that are in logic high states (SumB) from the number of sampled bits in signal SA that are in logic high states (SumA) to generate the reference value D. DCD calibration logic circuit 421 then stores the reference value D in memory in operation 507.

In an alternative embodiment, counter A circuit 442 counts the number of sampled bits generated by sampler A circuit 414 in signal SA that are in logic low states, and counter B circuit 443 counts the number of sampled bits generated by sampler B circuit 415 in signal SB that are in logic low states. In this embodiment, DCD calibration logic circuit 421 determines the percentage of sampled bits in signal SA that are in logic low states and the percentage of sampled bits in signal SB that are in logic low states. DCD calibration logic circuit 421 and PI circuit 413 then adjust the phases of clock signals CKS and CKSB based on these percentages to align the rising edges of clock signals CKS and CKSB with the rising and falling edges of signal DZ.

Serializer circuit 101 generates a serial data signal DSL by serializing an X number of parallel input data signals DIN in response to clock signals CKOUT and CKOUTB. During the second phase of the measurement and calibration process of FIG. 2 in operations 508-515, the data bits in input data signals DIN are set to an alternating pattern of logic high states and logic low states. Serializer circuit 101 serializes data signals DIN to generate serial data bits in data signal DSL that also have an alternating pattern of logic high states and logic low states. The data bits in the odd numbered unit intervals of signal DSL have logic high states, and the data bits in the even numbered unit intervals of signal DSL have logic low states. Thus, if 1 represents a logic high state, and 0 represents a logic low state, the data bits in data signal DSL have a repeating pattern of 101010101010 . . . during operations 508-515.

In the embodiment of FIG. 1, the input clock signals CKIN and CKINB generated by clock network 106 are provided to inputs of rise/fall time adjustment circuit 405. Rise/fall time adjustment circuit 405 generates output clock signals CKOUT and CKOUTB by delaying the input clock signals CKIN and CKINB that are generated by clock network 106. Rise/fall time adjustment circuit 405 is a duty cycle control circuit for clock signals CKOUT and CKOUTB. Rise/fall time adjustment circuit 405 sets the durations of the logic state transitions in clock signals CKOUT and CKOUTB based on 8 sets of digital control signals NA, NB, NC, ND, PA, PB, PC, and PD (i.e., NA-ND and PA-PD). Control signals NA, NB, NC, ND, PA, PB, PC, and PD are generated by DCD calibration logic circuit 421. In the embodiments described herein, NA, NB, NC, ND, PA, PB, PC, and PD each represents a set of multiple digital control signals.

The second phase of the measurement and calibration process of FIG. 2 begins at operation 508. In operation 508, the select signal SEL is set to a logic state that causes multiplexer circuit 411 to provide data signal DSL from one of its multiplexing inputs to its output as selected signal DZ.

In operation 509, sampler A circuit 414 samples selected signal DZ in response to clock signal CKS to generate serial sampled bits in signal SA, and sampler B circuit 415 samples selected signal DZ in response to clock signal CKSB to generate serial sampled bits in signal SB, as described above with respect to operation 503.

Before operation 509, multiplexer circuits 416 and 417 provide the logic states of header signals H1 and H0 to deserializer circuit 418 in selected signals M1 and M0, respectively, so that the bits from each of signals SA and SB can be identified in parallel signals DPL, as described above. During operation 509, multiplexer circuits 416 and 417 provide the logic states of signals SA and SB to deserializer circuit 418 in selected signals M1 and M0, respectively.

Deserializer circuit 418 deserializes serial bits in each of signals M1 and M0 to generate parallel bits in parallel signals DPL in response to clock signal CKP during operation 509. The first sets of parallel bits that deserializer circuit 418 generates in signals DPL include header bits. The header bits are generated based on the header signals H1 and H0 provided by multiplexer circuits 416-417 to deserializer circuit 418 prior to operation 509. The remaining bits that deserializer circuit 418 generates in signals DPL are sampled bits that are generated by sampler circuits 414-415 in signals SA-SB during operation 509.

In operation 510, counter A circuit 442 counts the number of sampled bits in signal SA that are in logic high states, and counter B circuit 443 counts the number of sampled bits in signal SB that are in logic high states. Also, in operation 510, DCD calibration logic circuit 421 determines the total number of sampled bits in signal SA and the total number of sampled bits in signal SB, as described above with respect to operation 504.

In decision operation 511, DCD calibration logic circuit 421 determines the percentage of sampled bits in signal SA that are in logic high states and the percentage of sampled bits in signal SB that are in logic high states based on the total number of sampled bits in each of signals SA and SB. DCD calibration logic circuit 421 determines how closely the rising edges in clock signals CKS and CKSB are aligned with the rising and falling edges of selected signal DZ based on the percentages of sampled bits in signals SA and SB that are in logic high states in decision operation 511, as described above with respect to decision operation 505. In operations 509-515, selected signal DZ is generated from data signal DSL, as described in operation 508.

If the rising edges of clock signals CKS and CKSB are not aligned with the rising and falling edges of selected signal DZ in decision operation 511, DCD calibration logic circuit 421 changes the logic states of the PIC signals in operation 512 to cause the rising edges of clock signals CKS and CKSB to align more closely to the rising and falling edges of selected signal DZ. Phase interpolator circuit 413 adjusts the phases of clock signals CKS and CKSB in operation 512 based on the changes in the logic states of the PIC signals that are generated by DCD calibration logic circuit 421. Circuit 400 repeats operations 509-512 until the rising edges of clock signals CKS and CKSB are as closely aligned to the rising and falling edges of selected signal DZ as possible.

When additional phase shifts cannot be made to clock signals CKS and CKSB to more closely align their rising edges with the rising and falling edges of signal DZ, circuit 400 proceeds to decision operation 513. In decision operation 513, DCD calibration logic circuit 421 subtracts the number of sampled bits in signal SB that are in logic high states (SumF) from the number of sampled bits in signal SA that are in logic high states (SumE) to generate the duty cycle distortion (DCD) value. In decision operation 513, DCD calibration logic circuit 421 determines if the DCD value equals the reference value D generated in operation 507. If the DCD value does not equal the reference value D in decision operation 513, DCD calibration logic circuit 421 changes the logic states of one or more of the rise/fall time control signals NA, NB, NC, ND, PA, PB, PC, and PD in operation 514.

Rise/fall time adjustment circuit 405 changes the durations of the logic high-to-low transitions in clock signal CKOUT based on changes in control signals PA and NA. Rise/fall time adjustment circuit 405 changes the durations of the logic low-to-high transitions in clock signal CKOUT based on changes in control signals PB and NB. Rise/fall time adjustment circuit 405 changes the durations of the logic high-to-low transitions in clock signal CKOUTB based on changes in control signals PD and ND. Rise/fall time adjustment circuit 405 changes the durations of the logic low-to-high transitions in clock signal CKOUTB based on changes in control signals PC and NC.

DCD calibration logic circuit 421 changes the logic states of the rise and fall time control signals PA-PD and NA-ND based on the difference between the DCD value and the reference value D. In operation 515, rise/fall time adjustment circuit 405 adjusts the durations of the rising and/or falling edges of clock signals CKOUT and/or CKOUTB based on the changes in the logic states of control signals PA-PD and NA-ND in order to reduce or eliminate duty cycle distortion in clock signals CKOUT and CKOUTB.

Examples are now provided to illustrate how rise/fall time adjustment circuit 405 may adjust the rise and fall times of the logic state transitions in clock signals CKOUT and CKOUTB. In these examples, serializer circuit 101 samples logic high bits in the Even signal in response to clock signal CKOUT, serializer circuit 101 samples logic low bits in the Odd signal in response to clock signal CKOUTB, the rising edges in signal DZ are shifted to align with the rising edges of clock signal CKS, and the falling edges in signal DZ are shifted to align with the rising edges of clock signal CKSB. As an example, if the DCD value is greater than the reference value D in decision operation 513, DCD calibration logic circuit 421 may cause rise/fall time adjustment circuit 405 to increase the durations of the falling edges of clock signal CKOUT and increase the durations of the rising edges of clock signal CKOUTB. As another example, if the DCD value is less than the reference value D in decision operation 513, DCD calibration logic circuit 421 may cause rise/fall time adjustment circuit 405 to decrease the durations of the falling edges of clock signal CKOUT and decrease the durations of the rising edges of clock signal CKOUTB.

Circuit 400 repeats operations 509-515 until the difference between SumE and SumF equals the reference value D, or is closer to the reference value D, in order to reduce or eliminate the duty cycle distortion in clock signals CKOUT and CKOUTB. When the DCD value equals or is close to the reference value D in decision operation 513, the process of FIG. 2 terminates as shown in bubble 516.

In an alternative embodiment, DCD calibration logic circuit 421 counts the number of sampled bits in each of signals SA and SB that are in logic low states. In this embodiment, DCD calibration logic circuit 421 adjusts the phases of clock signals CKS and CKSB and the duty cycles of clock signals CKOUT and CKOUTB based on these count values.

Figure 3:
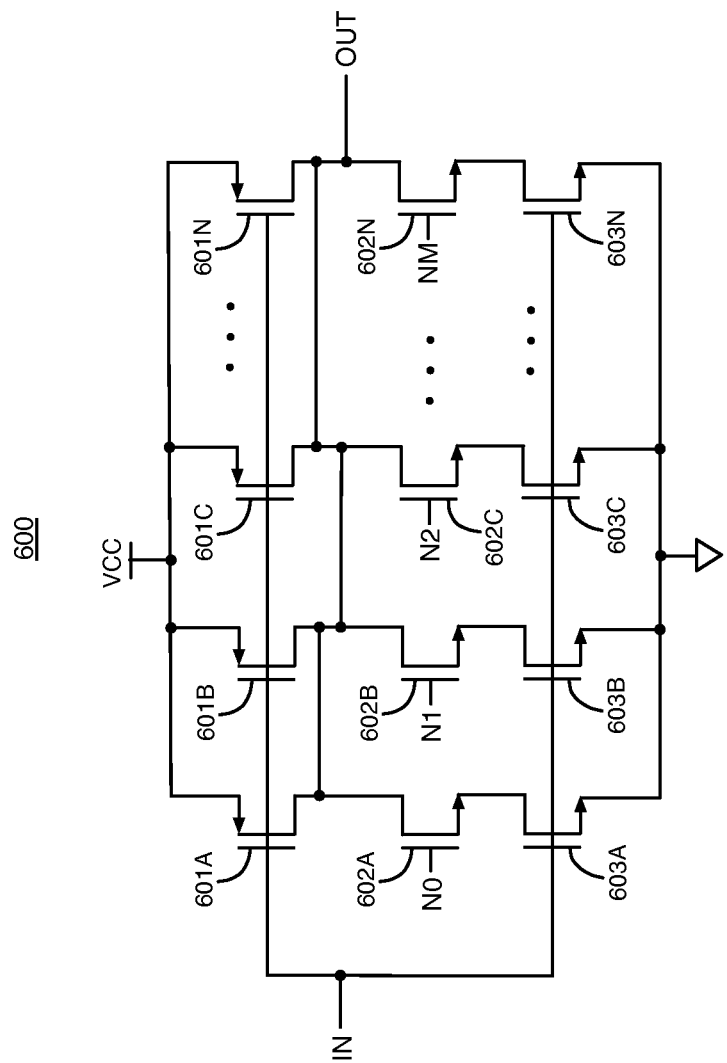
FIG. 3 illustrates an example of an inverting variable fall time buffer circuit, according to an embodiment of the present invention.

FIG. 3 illustrates an example of an inverting variable fall time buffer circuit 600, according to an embodiment of the present invention. Buffer circuit 600 is located in rise/fall time adjustment circuit 405. Buffer circuit 600 includes p-channel metal oxide semiconductor field-effect transistors (MOSFETs) 601A-601N. Buffer circuit 600 also includes n-channel MOSFETs 602A-602N and 603A-603N. Each set of transistors 601, 602, and 603 in buffer circuit 600 may have any number N (e.g., 8) of transistors. Four transistors in each set of transistors 601-603 are shown in FIG. 3 as an example and to simplify the drawing. Buffer circuit 600 delays and inverts the signal received at its input IN to generate a delayed and inverted output signal at its output OUT.

Transistors 601A-601N are coupled in parallel between a node at a supply voltage VCC and output OUT. The drains of transistors 602A-602N are coupled to output OUT. The sources of transistors 602A-602N are coupled to the drains of transistors 603A-603N, respectively. The sources of transistors 603A-603N are coupled to a node at a ground voltage. The gate of each of transistors 601A-601N and 603A-603N is coupled to input IN.

An N number of digital fall time control signals N0-NM are provided to the gates of transistors 602A-602N, respectively. M equals N−1. DCD calibration logic circuit 421 generates fall time control signals N0-NM. Each the 4 sets of fall time control signals NA, NB, NC, and ND includes a separate set of fall time control signals N0-NM.

DCD calibration logic circuit 421 changes the logic states of fall time control signals N0-NM in order to adjust the durations of the logic high-to-low transitions in the signal generated at output OUT. DCD calibration logic circuit 421 causes one or more of fall time control signals N0-NM to transition from high-to-low to turn off more of transistors 602A-602N. Turning off more of transistors 602A-602N reduces the total pull-down current through transistors 602A-602N and 603A-603N that pulls the voltage at output OUT from VCC to ground in response to a logic low-to-high transition in the input signal at IN. Thus, increasing the number of fall time control signals N0-NM that are in logic low states increases the durations of the logic high-to-low transitions in the signal generated at output OUT.

DCD calibration logic circuit 421 causes one or more of fall time control signals N0-NM to transition from low-to-high to turn on more of transistors 602A-602N. Turning on more of transistors 602A-602N increases the total pull-down current through transistors 602A-602N and 603A-603N that pulls the voltage at output OUT from VCC to ground in response to a logic low-to-high transition in the input signal at IN. Thus, increasing the number of fall time control signals N0-NM that are in logic high states decreases the durations of the logic high-to-low transitions in the signal generated at output OUT.

Figure 4:
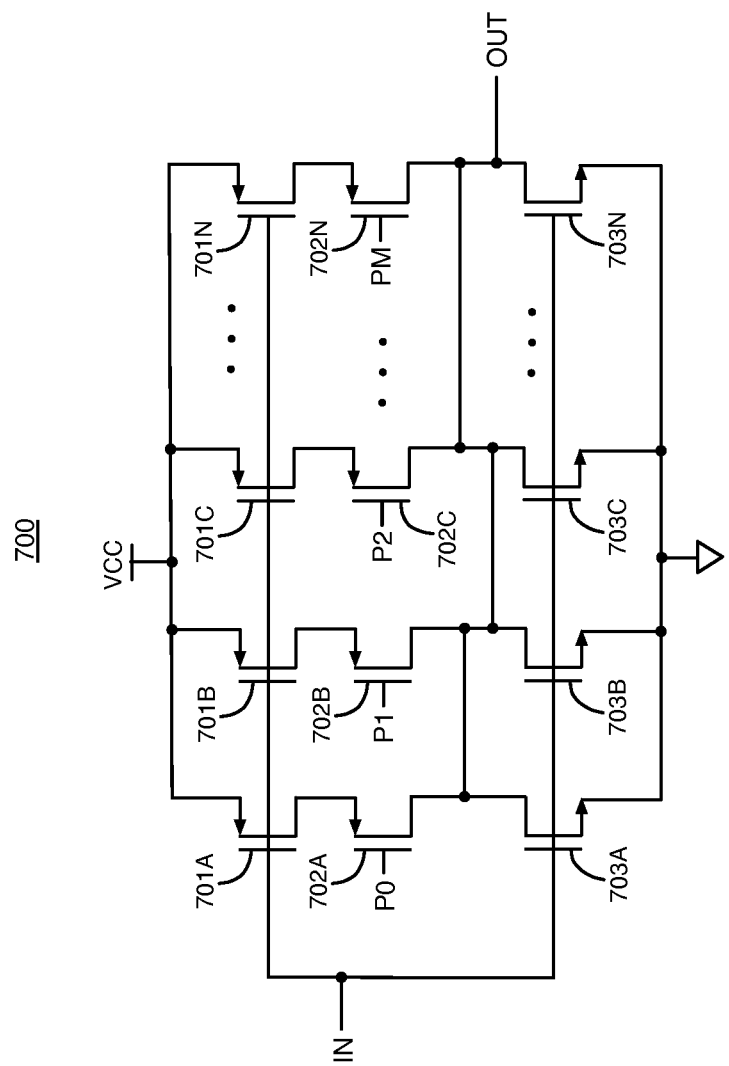
FIG. 4 illustrates an example of an inverting variable rise time buffer circuit, according to an embodiment of the present invention.

FIG. 4 illustrates an example of an inverting variable rise time buffer circuit 700, according to an embodiment of the present invention. Buffer circuit 700 is located in rise/fall time adjustment circuit 405. Buffer circuit 700 includes p-channel metal oxide semiconductor field-effect transistors (MOSFETs) 701A-701N and 702A-702N. Buffer circuit 700 also includes n-channel MOSFETs 703A-703N. Each set of transistors 701, 702, and 703 in buffer circuit 700 may have any number N (e.g., 8) of transistors. Four transistors in each set of transistors 701-703 are shown in FIG. 4 as an example and to simplify the drawing. Buffer circuit 700 delays and inverts the signal received at its input IN to generate a delayed and inverted output signal at its output OUT.

Transistors 701A-701N are coupled between a node at supply voltage VCC and the drains of transistors 702A-702N, respectively. The sources of transistors 702A-702N are coupled to output OUT. The drains of transistors 703A-703N are coupled to output OUT. The sources of transistors 703A-703N are coupled to a node at the ground voltage. The gate of each of transistors 701A-701N and 703A-703N is coupled to input IN.

An N number of digital rise time control signals P0-PM are provided to the gates of transistors 702A-702N, respectively. DCD calibration logic circuit 421 generates rise time control signals P0-PM. Each of the 4 sets of rise time control signals PA, PB, PC, and PD includes a separate set of rise time control signals P0-PM.

DCD calibration logic circuit 421 changes the logic states of rise time control signals P0-PM in order to adjust the durations of the logic low-to-high transitions in the signal generated at output OUT. DCD calibration logic circuit 421 causes one or more of rise time control signals P0-PM to transition from low-to-high to turn off more of transistors 702A-702N. Turning off more of transistors 702A-702N reduces the total pull-up current through transistors 701A-701N and 702A-702N that pulls the voltage at output OUT from ground to VCC in response to a logic high-to-low transition in the input signal at IN. Thus, increasing the number of rise time control signals P0-PM that are in logic high states increases the durations of the logic low-to-high transitions in the signal generated at output OUT.

DCD calibration logic circuit 421 causes one or more of rise time control signals P0-PM to transition from high-to-low to turn on more of transistors 702A-702N. Turning on more of transistors 702A-702N increases the total pull-up current through transistors 701A-701N and 702A-702N that pulls the voltage at output OUT from ground to VCC in response to a high-to-low transition in the input signal at IN. Thus, increasing the number of rise time control signals P0-PM that are in logic low states decreases the durations of the logic low-to-high transitions in the signal generated at output OUT.

Figure 5:
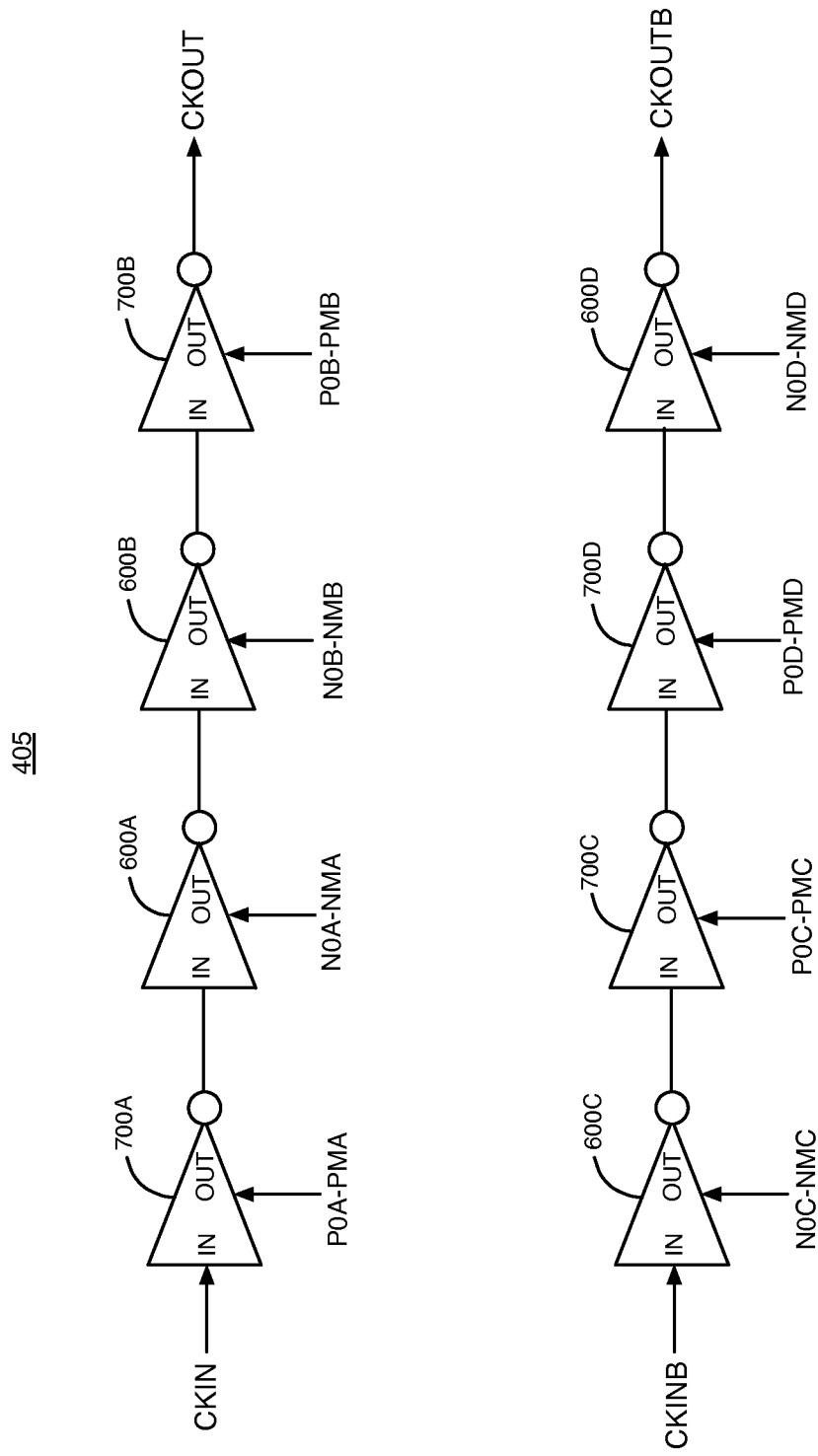
FIG. 5 illustrates an example of the rise/fall time adjustment circuit of FIG. 1, according to an embodiment of the present invention.

FIG. 5 illustrates an example of rise/fall time adjustment circuit 405, according to an embodiment of the present invention. Rise/fall time adjustment circuit 405 includes inverting variable rise time buffer circuits 700A-700D and inverting variable fall time buffer circuits 600A-600D.

Each of the inverting variable rise time buffer circuits 700A-700D includes the circuitry of variable rise time buffer circuit 700 as shown in FIG. 4. Each of the inverting variable fall time buffer circuits 600A-600D includes the circuitry of variable fall time buffer circuit 600 as shown in FIG. 3.

Buffer circuits 700A, 600A, 600B, and 700B are coupled together in series as shown in FIG. 5. Buffer circuits 600C, 700C, 700D, and 600D are coupled together in series as shown in FIG. 5.

Clock signal CKIN is provided to the IN input of buffer circuit 700A. Clock signal CKINB is provided to the IN input of buffer circuit 600C. The output signals generated at the OUT outputs of buffer circuits 700A, 600A, and 600B are provided to the IN inputs of buffer circuits 600A, 600B, and 700B, respectively. The output signals generated at the OUT outputs of buffer circuits 600C, 700C, and 700D are provided to the IN inputs of buffer circuits 700C, 700D, and 600D, respectively. Buffer circuit 700B generates clock signal CKOUT at its OUT output. Buffer circuit 600D generates clock signal CKOUTB at its OUT output.

Rise time control signals P0A-PMA, P0B-PMB, P0C-PMC, and P0D-PMD are provided to control inputs of inverting variable rise time buffer circuits 700A, 700B, 700C, and 700D, respectively. The 4 sets of rise time control signals P0A-PMA, P0B-PMB, P0C-PMC, and P0D-PMD correspond to the rise time control signals P0-PM shown in FIG. 4 in buffer circuits 700A-700D, respectively. Fall time control signals N0A-NMA, N0B-NMB, N0C-NMC, and N0D-NMD are provided to control inputs of inverting variable fall time buffer circuits 600A, 600B, 600C, and 600D, respectively. The 4 sets of fall time control signals N0A-NMA, N0B-NMB, N0C-NMC, and N0D-NMD correspond to the fall time control signals N0-NM shown in FIG. 3 in buffer circuits 600A-600D, respectively.

DCD calibration logic circuit 421 generates control signals P0A-PMA, P0B-PMB, P0C-PMC, P0D-PMD, N0A-NMA, N0B-NMB, N0C-NMC, and N0D-NMD. Rise time control signals P0A-PMA, P0B-PMB, P0C-PMC, and P0D-PMD are the rise time control signals PA, PB, PC, and PD, respectively, that are described above with respect to FIG. 1. Fall time control signals N0A-NMA, N0B-NMB, N0C-NMC, and N0D-NMD are the fall time control signals NA, NB, NC, and ND, respectively, that are described above with respect to FIG. 1. Thus, in the embodiment of FIG. 5, each of the 8 sets of control signals PA, PB, PC, PD, NA, NB, NC, and ND includes an N number of control signals numbered 0 through M.

In the embodiment of FIG. 5, DCD calibration logic circuit 421 varies the logic states of control signals P0A-PMA and N0A-NMA in order to vary the durations of the logic high-to-low transitions in clock signal CKOUT. DCD calibration logic circuit 421 varies the logic states of control signals P0B-PMB and N0B-NMB in order to vary the durations of the logic low-to-high transitions in clock signal CKOUT. DCD calibration logic circuit 421 varies the logic states of the control signals P0C-PMC and N0C-NMC in order to vary the durations of the logic low-to-high transitions in clock signal CKOUTB. DCD calibration logic circuit 421 varies the logic states of the control signals P0D-PMD and N0D-NMD in order to vary the durations of the logic high-to-low transitions in clock signal CKOUTB. DCD calibration logic circuit 421 varies the durations of the logic low-to-high and logic high-to-low transitions in clock signals CKOUT and CKOUTB in order to reduce or eliminate duty cycle distortion in clock signals CKOUT and CKOUTB, as described above with respect to FIGS. 1-2.

Figure 6:
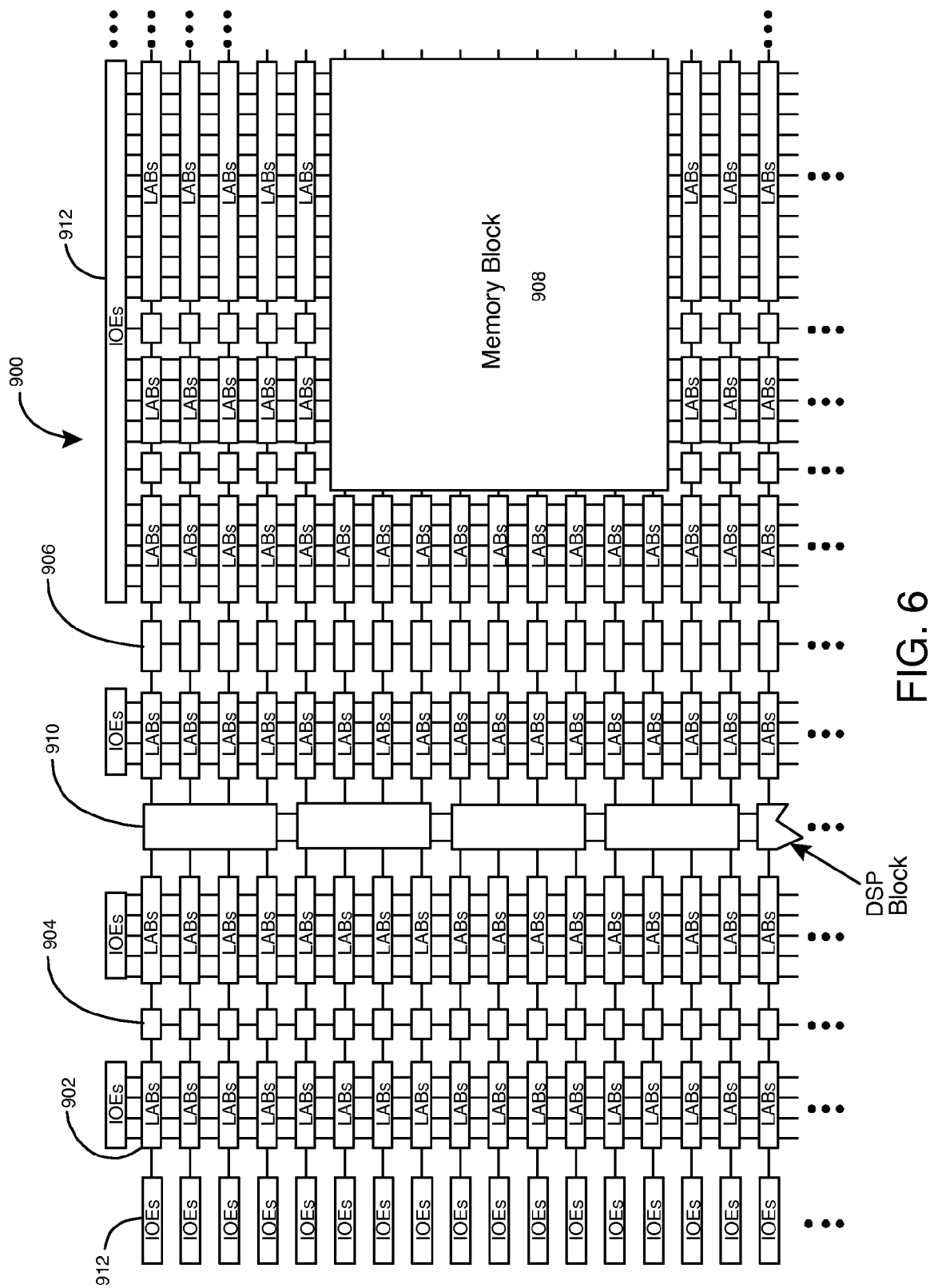
FIG. 6 is a simplified partial block diagram of a field programmable gate array (FPGA) that can include aspects of the present invention.

FIG. 6 is a simplified partial block diagram of a field programmable gate array (FPGA) 900 that can include aspects of the present invention. FPGA 900 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 900 includes a two-dimensional array of programmable logic array blocks (or LABs) 902 that are interconnected by a network of column and row interconnect conductors of varying length and speed. LABs 902 include multiple (e.g., 10) logic elements (or LEs).

A logic element (LE) is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 900 also includes a distributed memory structure including random access memory (RAM) blocks of varying sizes provided throughout the array. The RAM blocks include, for example, blocks 904, blocks 906, and block 908. These memory blocks can also include shift registers and first-in-first-out (FIFO) buffers.

FPGA 900 further includes digital signal processing (DSP) blocks 910 that can implement, for example, multipliers with add or subtract features. Input/output elements (IOEs) 912 support numerous single-ended and differential input/output standards. IOEs 912 include input and output buffers that are coupled to pins of the integrated circuit. The pins are external terminals of the FPGA die that can be used to route, for example, input signals, output signals, and supply voltages between the FPGA and one or more external devices. One or more of IOEs 912 may include the circuitry shown in FIG. 1. FPGA 900 is described herein for illustrative purposes.

Embodiments of the present invention can be implemented in many different types of integrated circuits.

Figure 7:
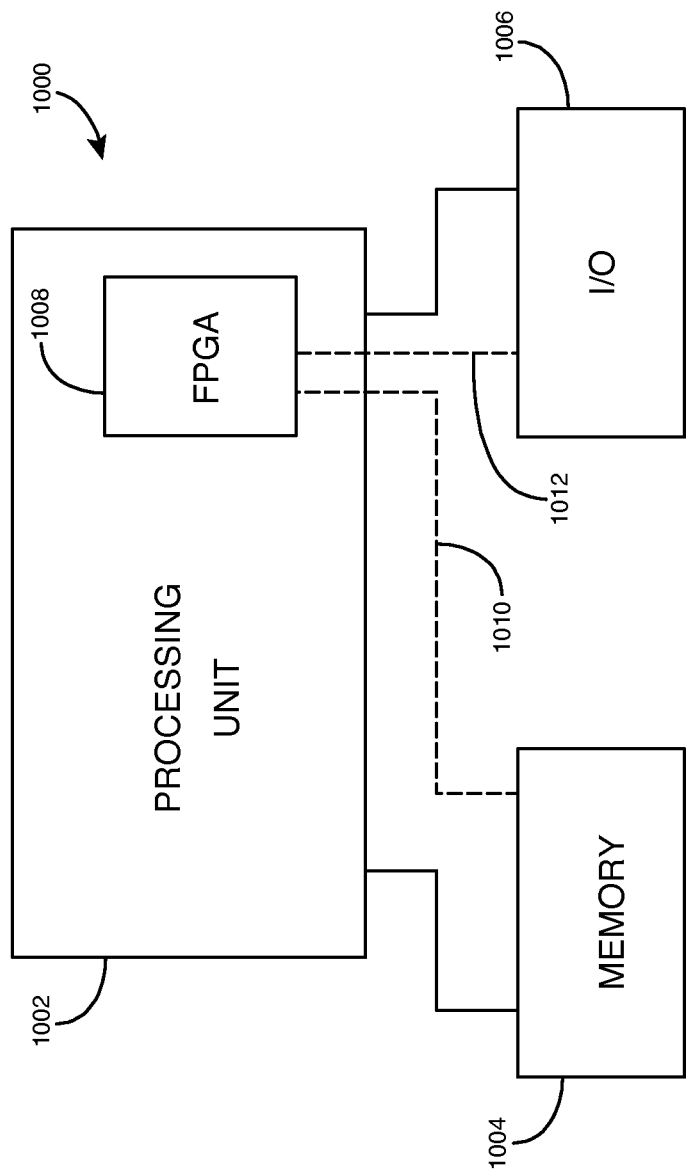
FIG. 7 shows a block diagram of an exemplary digital system that can embody techniques of the present invention.

The present invention can also be implemented in a system that has an FPGA as one of several components. FIG. 7 shows a block diagram of an exemplary digital system 1000 that can embody techniques of the present invention. System 1000 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 1000 can be provided on a single board, on multiple boards, or within multiple enclosures.

System 1000 includes a processing unit 1002, a memory unit 1004, and an input/output (I/O) unit 1006 interconnected together by one or more buses. According to this exemplary embodiment, an FPGA 1008 is embedded in processing unit 1002. FPGA 1008 can serve many different purposes within the system of FIG. 7. FPGA 1008 can, for example, be a logical building block of processing unit 1002, supporting its internal and external operations. FPGA 1008 is programmed to implement the logical functions necessary to carry on its particular role in system operation. FPGA 1008 can be specially coupled to memory 1004 through connection 1010 and to I/O unit 1006 through connection 1012.

Processing unit 1002 can direct data to an appropriate system component for processing or storage, execute a program stored in memory 1004, receive and transmit data via I/O unit 1006, or other similar functions. Processing unit 1002 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 1008 can control the logical operations of the system. As another example, FPGA 1008 acts as a reconfigurable processor that can be reprogrammed as needed to handle a particular computing task. Alternatively, FPGA 1008 can itself include an embedded microprocessor. Memory unit 1004 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A system comprising:
a transmitter circuit operable to provide an output signal in response to a first periodic signal;
a multiplexer circuit operable to provide a second periodic signal as a selected signal during a first phase of operation, wherein the multiplexer circuit is operable to provide the output signal of the transmitter circuit as the selected signal during a second phase of operation;
a sampler circuit operable to generate first samples of the selected signal in response to a third periodic signal during the first phase of operation, wherein the sampler circuit is operable to generate second samples of the selected signal in response to the third periodic signal during the second phase of operation; and
a duty cycle control circuit operable to adjust a duty cycle of the first periodic signal based on the first and the second samples.

2. The system of claim 1 further comprising:
a phase shift circuit operable to generate the third periodic signal; and
a calibration circuit operable to cause the phase shift circuit to adjust a phase of the third periodic signal based on the first and the second samples.

3. The system of claim 1, wherein the system is in a programmable logic integrated circuit.

4. A system comprising:
a transmitter circuit operable to provide an output signal in response to a first periodic signal;
a multiplexer circuit operable to provide a second periodic signal as a selected signal during a first phase of operation, wherein the multiplexer circuit is operable to provide the output signal of the transmitter circuit as the selected signal during a second phase of operation;
a first sampler circuit operable to generate first samples of the selected signal during the first phase of operation, wherein the first sampler circuit is operable to generate second samples of the selected signal during the second phase of operation;
a second sampler circuit operable to generate third samples of the selected signal during the first phase of operation, wherein the second sampler circuit is operable to generate fourth samples of the selected signal during the second phase of operation; and
a duty cycle control circuit operable to adjust a duty cycle of the first periodic signal based on the first, the second, the third, and the fourth samples.

5. The system of claim 4 further comprising:
a phase shift circuit operable to generate third and fourth periodic signals, wherein the first sampler circuit is operable to generate the first and the second samples in response to the third periodic signal, and wherein the second sampler circuit is operable to generate the third and the fourth samples in response to the fourth periodic signal; and
a calibration circuit operable to cause the phase shift circuit to adjust phases of the third and the fourth periodic signals based on the first and the third samples during the first phase of operation, wherein the calibration circuit is operable to cause the phase shift circuit to adjust the phases of the third and the fourth periodic signals based on the second and the fourth samples during the second phase of operation.

6. The system of claim 5 further comprising:
an oscillator circuit operable to generate the second periodic signal, wherein the oscillator circuit is operable to generate a fifth periodic signal that is provided to an input of the phase shift circuit.

7. The system of claim 4 further comprising:
a calibration circuit operable to compare a difference between the first and the third samples to a difference between the second and the fourth samples to determine an adjustment for the duty cycle control circuit to provide to the duty cycle of the first periodic signal.

8. A system comprising:
a transmitter circuit operable to provide an output signal in response to a first periodic signal;
a multiplexer circuit operable to provide a second periodic signal as a selected signal during a first phase of operation, wherein the multiplexer circuit is operable to provide the output signal of the transmitter circuit as the selected signal during a second phase of operation;
a sampler circuit operable to generate first samples of the selected signal during the first phase of operation, wherein the sampler circuit is operable to generate second samples of the selected signal during the second phase of operation;
a duty cycle control circuit operable to adjust a duty cycle of the first periodic signal based on the first and the second samples; and
a calibration circuit operable to control a pull-up current and a pull-down current in the duty cycle control circuit based on the first and the second samples to control the duty cycle of the first periodic signal.

9. A system comprising:
a transmitter circuit operable to provide an output signal in response to a first periodic signal;
a multiplexer circuit operable to provide a second periodic signal as a selected signal during a first phase of operation, wherein the multiplexer circuit is operable to provide the output signal of the transmitter circuit as the selected signal during a second phase of operation;
a sampler circuit operable to generate first samples of the selected signal during the first phase of operation, wherein the sampler circuit is operable to generate second samples of the selected signal during the second phase of operation; and
a duty cycle control circuit operable to adjust a duty cycle of the first periodic signal based on the first and the second samples,
wherein the duty cycle control circuit comprises a first buffer circuit operable to provide a variable pull-up current and a second buffer circuit operable to provide a variable pull-down current, wherein the first and the second buffer circuits buffer a third periodic signal to generate the first periodic signal, and wherein the variable pull-up current of the first buffer circuit and the variable pull-down current of the second buffer circuit are varied based on the first and the second samples.

10. A system comprising:
a transmitter circuit operable to provide an output signal in response to a first periodic signal;
a multiplexer circuit operable to provide a second periodic signal as a selected signal during a first phase of operation, wherein the multiplexer circuit is operable to provide the output signal of the transmitter circuit as the selected signal during a second phase of operation;
a sampler circuit operable to generate first samples of the selected signal during the first phase of operation, wherein the sampler circuit is operable to generate second samples of the selected signal during the second phase of operation;
a duty cycle control circuit operable to adjust a duty cycle of the first periodic signal based on the first and the second samples; and
a calibration circuit operable to compare a count of the first samples to a count of the second samples to determine an adjustment for the duty cycle control circuit to provide to the duty cycle of the first periodic signal.

11. A circuit comprising:
a transmitter circuit operable to provide an output signal in response to a first periodic signal;
a multiplexer circuit operable to provide a second periodic signal as a selected signal during a first phase of operation, wherein the multiplexer circuit is operable to provide the output signal of the transmitter circuit as the selected signal during a second phase of operation;

sampler circuitry operable to generate first samples of the selected signal during the first phase of operation and second samples of the selected signal during the second phase of operation, wherein the sampler circuitry is operable to generate third samples of the selected signal during the first phase of operation and fourth samples of the selected signal during the second phase of operation, wherein the first and the third samples indicate timing of rising edges in the selected signal, and wherein the second and the fourth samples indicate timing of falling edges in the selected signal;

a duty cycle control circuit operable to control a duty cycle of the first periodic signal; and a calibration circuit operable to cause the duty cycle control circuit to adjust the duty cycle of the first periodic signal based on a comparison between the first samples and the second samples.

12. The circuit of claim 11, wherein the calibration circuit is operable to determine a first difference between a number of the first samples having a predefined state and a number of the third samples having the predefined state, wherein the calibration circuit is operable to determine a second difference between a number of the second samples having the predefined state and a number of the fourth samples having the predefined state, and wherein the calibration circuit is operable to cause the duty cycle control circuit to adjust the duty cycle of the first periodic signal based on a comparison between the first difference and the second difference.

13. The circuit of claim 11 further comprising:

a phase shift circuit operable to generate third and fourth periodic signals, wherein the sampler circuitry is operable to generate the first and the second samples in response to the third periodic signal, and wherein the sampler circuitry is operable to generate the third and the fourth samples in response to the fourth periodic signal, wherein the calibration circuit is operable to cause the phase shift circuit to adjust phases of the third and the fourth periodic signals based on the first and the third samples during the first phase of operation, and wherein the calibration circuit is operable to cause the phase shift circuit to adjust the phases of the third and the fourth periodic signals based on the second and the fourth samples during the second phase of operation.

14. The circuit of claim 11, wherein the calibration circuit is operable to control a pull-up current and a pull-down current in the duty cycle control circuit based on the first and the second samples to control the duty cycle of the first periodic signal.

15. The circuit of claim 11, wherein the duty cycle control circuit comprises a first buffer circuit operable to provide a variable pull-up current and a second buffer circuit operable to provide a variable pull-down current, wherein the first and the second buffer circuits buffer a third periodic signal to generate the first periodic signal, and wherein the calibration circuit varies the variable pull-up current of the first buffer circuit and the variable pull-down current of the second buffer circuit based on the first and the second samples.

16. A method comprising:

generating a data signal in response to a first periodic signal;

providing a second periodic signal as a selected signal during a first phase of operation;

providing the data signal as the selected signal during a second phase of operation;

generating first samples of the selected signal during the first phase of operation;

generating second samples of the selected signal during the second phase of operation; and adjusting a duty cycle of the first periodic signal based on the first and the second samples to reduce duty cycle distortion in the first periodic signal.

17. The method of claim 16 further comprising:

generating third samples of the selected signal during the first phase of operation; and generating fourth samples of the selected signal during the second phase of operation, wherein the first and the third samples indicate timing of rising edges in the selected signal, and wherein the second and the fourth samples indicate timing of falling edges in the selected signal.

18. The method of claim 17 further comprising:

determining a first difference between a number of the first samples having a predefined state and a number of the third samples having the predefined state;

determining a second difference between a number of the second samples having the predefined state and a number of the fourth samples having the predefined state; and adjusting the duty cycle of the first periodic signal based on a comparison between the first difference and the second difference.

19. The method of claim 16 further comprising:

generating a third periodic signal, wherein generating first samples of the selected signal during the first phase of operation comprises generating the first samples of the selected signal in response to the third periodic signal, and wherein generating second samples of the selected signal during the second phase of operation comprises generating the second samples of the selected signal in response to the third periodic signal; and adjusting a phase of the third periodic signal based on the first and the second samples to reduce misalignment between edges of the third periodic signal and edges of the selected signal.

20. The method of claim 16, wherein adjusting a duty cycle of the first periodic signal based on the first and the second samples to reduce duty cycle distortion in the first periodic signal comprises controlling a pull-up current in a first buffer and a pull-down current in a second buffer based on the first and the second samples to control the duty cycle of the first periodic signal.

21. The method of claim 16, wherein generating a data signal in response to a first periodic signal comprises generating the data signal in response to the first periodic signal using a transmitter circuit, wherein generating first samples of the selected signal during the first phase of operation and generating second samples of the selected signal during the second phase of operation further comprise generating the first and the second samples using a sampler circuit, and wherein providing a second periodic signal as a selected signal during the first phase of operation and providing the data signal as the selected signal during the second phase of operation further comprise generating the selected signal using a multiplexer circuit.

* * * * *